(12) United States Patent
Bore et al.

(10) Patent No.: US 6,236,348 B1
(45) Date of Patent: May 22, 2001

(54) ANALOG/DIGITAL CONVERTER WITH TREE-STRUCTURED FOLDING CIRCUIT

(75) Inventors: François Bore, Grenoble; Marc Wingender, Saint Egreve, both of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/508,106

(22) PCT Filed: Sep. 21, 1998

(86) PCT No.: PCT/FR98/02013

§ 371 Date: Mar. 17, 2000

§ 102(e) Date: Mar. 17, 2000

(87) PCT Pub. No.: WO99/16173

PCT Pub. Date: Apr. 1, 1999

(30) Foreign Application Priority Data

Sep. 19, 1997 (FR) .................................................. 97 11699

(51) Int. Cl.⁷ ...................................................... H03M 1/12
(52) U.S. Cl. .......................................... 341/155; 341/156
(58) Field of Search .................................... 341/155, 156, 341/158, 159

(56) References Cited

U.S. PATENT DOCUMENTS

| | | | |
|---|---|---|---|
| 4,804,940 | * 2/1989 | Takigawa et al. | 341/133 |
| 5,126,742 | * 6/1992 | Schmidt et al. | 341/156 |
| 5,151,700 | * 9/1992 | Matsurawa et al. | 341/156 |
| 5,181,035 | * 1/1993 | Mouret | 341/159 |
| 5,307,067 | * 4/1994 | Kimura et al. | 341/159 |
| 5,444,447 | 8/1995 | Wingender | 341/156 |
| 5,471,210 | 11/1995 | Wingender et al. | 341/156 |
| 5,684,486 | * 11/1997 | Ono et al. | 341/159 |

* cited by examiner

*Primary Examiner*—Peguy JeanPierre
*Assistant Examiner*—Jean Bruner Jeanglaude
(74) *Attorney, Agent, or Firm*—Oblon, Spivak, McClelland, Maier & Neustadt, P.C.

(57) ABSTRACT

Signal-folding converters which establish two so-called fold analogue signals, whose curves of variation as a function of a voltage Vin to be converted cross over at multiple points. The architecture establishes n pairs of voltages varying with Vin and crossing over for regularly distributed values Vin= $V_k$. At least two current routing circuits are provided, each of which possesses at least three pairs of inputs and at least two outputs including a direct output and an inverse output. The direct outputs, linked together, provide a folded signal SR; the inverse outputs provide a complementary folded signal SRb. Each routing circuit receives three voltage pairs of rank k−1, k, and k+1 and includes a current source supplying a group of branches arranged as a tree-like structure. The apportioning of the current in each branchoff depends on the voltage pairs of rank k−1, k, and k+1, and the direct and inverse outputs of the circuit are tapped respectively from two different branches of the last stage of the tree-like structure.

8 Claims, 7 Drawing Sheets

ROUTING CIRCUIT CA$_i$

ANALOG/DIGITAL CONVERTER WITH TREE-STRUCTURED FOLDING CIRCUIT

BACKGROUND OF THE INVENTION

1. Field of the Invention

The invention relates to analogue/digital converters, that is to say electronic circuits capable of converting an analogue input signal into an accurate digital value representing the amplitude of the analogue signal. The numerical value is obtained in the form of a word of several bits, coded in pure binary or in some other code.

2. Discussion of the Background

Several conversion processes exist, and the choice of one process rather than another depends on the performance expected of the converter. The most important parameters of this performance are:

resolution, defined by the number of bits of the output word representing with precision the amplitude of the analogue signal; the number of bits can be from 16 to 18, or even 20, for the most accurate converters, and the accuracy is generally plus or minus ½ of a lowest-order bit;

speed, that is to say the number of conversion operations which can be performed in one second;

power consumption: a fast and accurate converter consumes much more energy than a slow and inaccurate converter; now, the power consumption causes heating of the integrated circuit chip on which the converter is made. This heating must be compensated for by means of cooling which make the circuit difficult to use when there are bulkiness constraints to be complied with. Moreover, with the proliferation of so-called "portable" equipment (those which operate with the aid of batteries), the "high power consumption" criterion also becomes synonymous with "low lifetime of the equipment";

and of course the design and fabrication cost of the converter related in particular to the area of the integrated circuit chip used by the converter.

The qualities of an analogue/digital converter result from a compromise between the above parameters and an objective of the present invention is to improve this compromise.

Among the known structures of analogue/digital converters may be cited:

successive-approximation converters, operating relatively slowly;

"flash" converters which use $2^N$ comparators in parallel, of bulky structure and consuming high power;

interpolation converters, with series structure (several cascaded stages) or parallel structure;

signal-folding converters.

SUMMARY OF THE INVENTION

The invention is addressed at this latter category of converter, which may moreover be associated with other categories in mixed converters.

The role of a signal folding circuit is to produce at least two so-called "folded" voltages: these are analogue voltages which vary substantially sinusoidally as a function of the voltage Vin to be converted, and which cross over for several values of Vin which are perfectly determined reference values regularly distributed within a voltage interval where Vin is apt to vary.

The signal folding circuit may have two different functions (and in general it will have both):

it provides information regarding the position of the voltage Vin with respect to the various reference values; this information serves to establish the high-order bits of the analogue/digital conversion, and, moreover, at its output it provides folded analogue voltages which can be used by series or parallel interpolation circuits to provide lower-order bits improving the resolution of the analogue/digital conversion.

An objective of the present invention is to propose such a signal folding circuit and to incorporate it into an analogue/digital converter architecture. The circuit proposed offers a good compromise between the parameters mentioned hereinabove, and in particular the accuracy and power consumption.

There is therefore proposed an analogue/digital converter which comprises a signal folding circuit comprising:

means for producing n pairs of voltages varying monotonically with Vin, the voltages of a pair of rank k crossing over when Vin has a reference value equal to $V_k$ and varying linearly around their crossover point, the voltages $V_k$ being regularly distributed, at least two current routing circuits, each of which possesses at least three pairs of inputs and at least two outputs called the direct output and the inverse output, a routing circuit of rank i having the following characteristics:

it receives at least the voltage pairs of rank k−1, k and k+1, the circuits of different rank receiving different sets of voltage pairs, it comprises a current source supplying a group of branches arranged as a tree-like-like structure with at least two stages, the last of which comprises at least four branches, each branch of a stage supplying two branches of the next stage, the apportioning of the current in each branchoff being dependent on the voltage pairs of rank k−1, k and k+1, and the direct and inverse outputs of this circuit being tapped respectively from two different branches of the last stage, the direct outputs of the various routing circuits being linked together so as to add together the currents which flow through them and providing a first folded signal, and the inverse outputs also being linked together and providing a second folded signal complementary to the first.

Information regarding the position of Vin with respect to the reference voltages is obtained by combining the currents emanating from the branches of the last stage of several different routing circuits, and this information is used to produce high-order bits of the analogue/digital conversion of the signal Vin.

Two main implementations of the invention may be provided for. In a first implementation, the routing circuits have two stages and make it possible to route the current selectively to one of the four branches of the second stage. If one of the routing circuits receives the voltage pairs crossing over for Vin equal to $V_{k-1}$, $V_k$, $V_{k+1}$, the current is preferentially routed as a function of the relative position of Vin with respect to these three references. The next circuit receives the voltage pairs crossing over for Vin=$V_{k+1}$, $V_{k+2}$, $V_{k+3}$; there are at least (n−1)/2 routing circuits (possibly one more at one end) if there are n references $V_k$.

In another implementation, the routing circuits have three stages and make it possible to route the current preferentially towards one of the eight branches of the third stage as a function of the position of Vin with respect to seven voltage references which are $V_{k-3}$, $V_{k-2}$, $V_{k-1}$, $V_k$, $V_{k+1}$, $V_{k+2}$, $V_{k+3}$.

The routing circuit receives seven pairs of control voltages crossing over for these reference values. The neighbouring circuit, if there is one, receives the group of next voltages corresponding to the references $V_{k+3}$ and the next six. The currents of at least three of the output branches on the one hand, and three other output branches on the other hand are added together to produce the two complementary folded signals.

It would be possible to generalize to any number of stages, by indicating that the signal folding circuit comprises M current routing circuits with tree-like-like structure with Z stages supplied by a current source, with Z at least equal to 2, each routing circuit having $2^Z-1$ pairs of inputs each receiving a voltage pair tapped off from the n pairs, the $2^z-1$ voltage pairs corresponding to $2^z-1$ adjacent references $V_k$, the current of the source being routed preferentially into one branch from among $2^z$ output branches as a function of the values of the input voltages, and the routing circuit having a direct output obtained by the merging of $2^z-1$ different output branches and an inverse output obtained by the merging of $2^{z-1}-1$ other output branches, the direct outputs of the various routing circuits being linked together and providing a first folded signal, and the inverse outputs also being linked together and providing a second folded signal. It should be noted that in the case where there are at least three stages in the tree-like-like structures (Z greater than or equal to 3), it is possible to have only a single routing circuit to carry out the folding, whereas if Z is less than or equal to 2 there are necessarily several routing circuits.

Lastly, the converter can comprise a second signal folding circuit, using current routers with tree-like-like structure, to produce two other folded signals, varying with Vin in phase quadrature with the first ones. This can be useful when the folded signals are used for fine analogue/digital conversion with the aid of an interpolation circuit with several cascaded stages: the first stage then receives four folded signals, two of which are complementary and the other two of which are in phase quadrature with the first two.

In this case, the routing circuits of the second folding circuit receive pairs of input voltages which originate not from the two complementary outputs of the same amplifier, as would occur for the routers of the first folding circuit, but from two outputs of different (adjacent) amplifiers. These voltage pairs then cross over not for the references $V_k$ but for references situated in the middle of the intervals between the references $V_k$. This assumes however that the references $V_k$ are sufficiently close to one another for the curves of variation as a function of Vin still to cross over in their zone of linear variation.

For the practical embodiment of the routing circuits with tree-like-like structure, it will be possible to take into account the fact that the routers consist of transistors and that these transistors introduce a common-mode voltage drop from a stage of greater rank to a stage of lesser rank. It will then be preferable for the n control voltage pairs of the routers to have a common-mode voltage adjusted as a function of the rank of the controlled stage. If one of the voltage pairs is to control several routers belonging to stages of different ranks, there will then be provision for this voltage pair to be split into two differential voltage pairs which are identical but of different common modes.

BRIEF DESCRIPTION OF THE DRAWINGS

Other characteristics and advantages of the invention will become apparent on reading the detailed description which follows and which is given with reference to the appended drawings in which.

DESCRIPTION OF THE PREFERRED EMBODIMENTS

Figure 1:
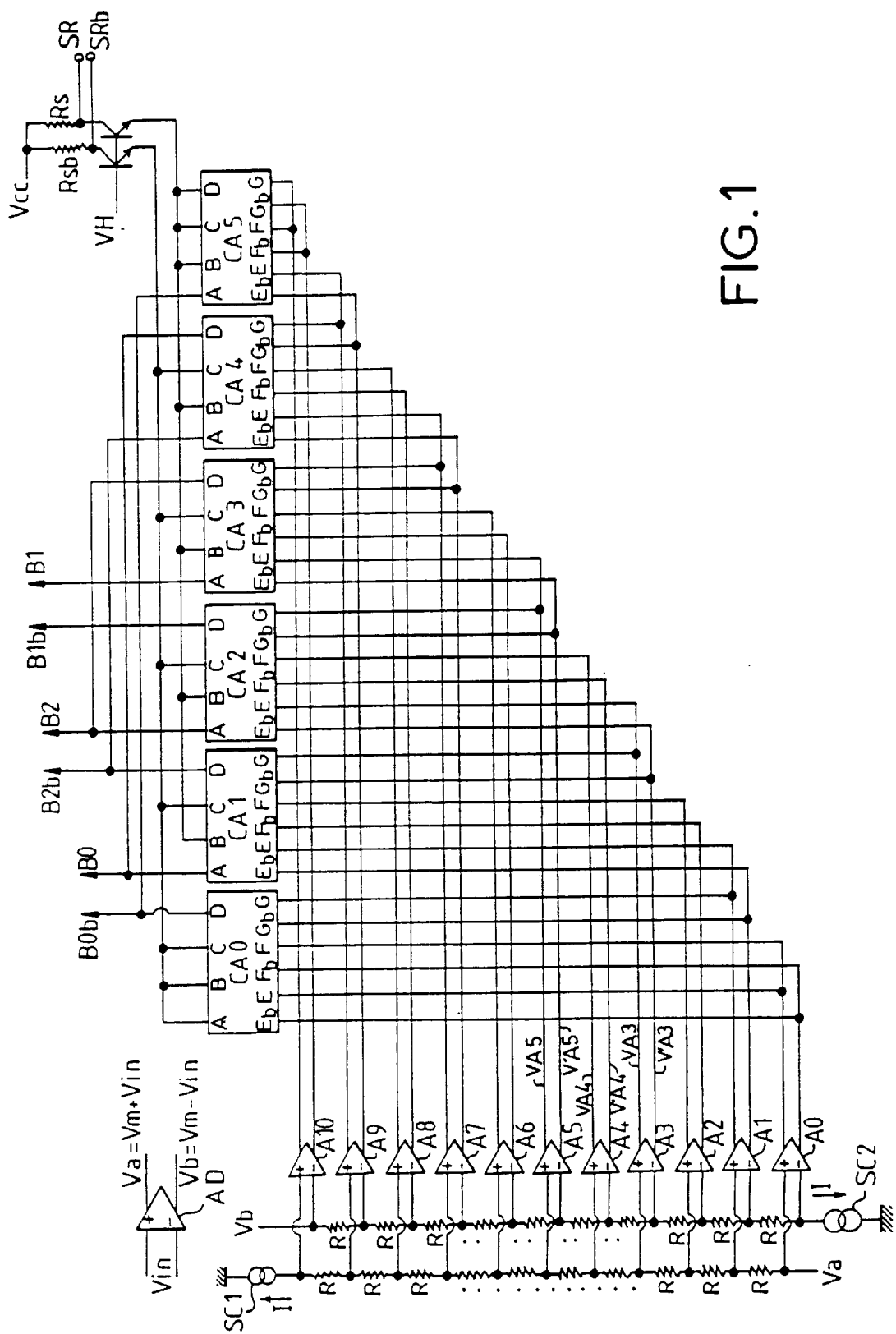
FIG. 1 represents a general diagram of an analogue/digital converter with folding circuit using several current routing circuits.

The converter of FIG. 1 comprises circuitry (not represented) for sampling and holding the voltage to be converted; it will therefore be considered hereinbelow that the input voltage to be converted is a sampled and held voltage Vin.

The converter comprises circuitry for producing, from this voltage Vin, n pairs of voltages which can vary as a function of Vin and which are different from one another. The two voltages of one and the same pair (of rank k) vary symmetrically and cross over when Vin has a reference value $V_k$. The n values $V_k$ are regularly distributed within the span where Vin is apt to vary.

There are several ways of producing these n voltage pairs. The simplest would be to take n amplifiers having differential outputs and receiving Vin and $V_k$ as differential input. The example described in FIG. 1 uses another solution with a dual resistor bridge.

The voltage Vin is applied as differential input to a first differential amplifier AD which on two outputs provides voltages Va=Vm+Vin and Vb=Vm−Vin, where Vm is a common-mode voltage of the amplifier. One of the voltages (Va) is applied to the head of a first resistor bridge whose tail is supplied by a current source SC1 of value I. The other voltage (Vb) is applied at the head of a second resistor bridge whose tail is supplied by a current source SC2 of like value I.

The series resistors have values which are well defined with respect to one another, and in practice there are at least n−1 identical resistors, of value R, in each bridge.

The voltages on the taps of the first bridge are successively: Va, Va−RI, Va−2RI, etc., Va−(n−1)RI.

The voltages on the taps of the second bridge are successively: Vb, Vb−RI, Vb−2RI, etc.

Downstream of the resistor bridges have been disposed n differential amplifiers $A_0$ to $A_{n-1}$. The first bridge is represented head down so as to simplify the representation of the connections between the taps of the bridge and the amplifiers.

Each amplifier receives two input voltages, one emanating from an intermediate tap of the first bridge and the other from an intermediate tap of the second bridge. Consequently, one of the input voltages of an amplifier varies as Va−pRI, that is to say as Vm+Vin−pRI, whilst the other varies as Vb−qRI, that is to say as Vm−Vin−qRI. The integers p and q represent the positions of the taps in each of the bridges, in the sense that p resistors of value R are interposed between the voltage Va and the tap of the first bridge, whilst q resistors are interposed between the voltage Vb and the tap of the second bridge.

The voltages at the input of the amplifier connected to taps p and q are therefore equal for Vin=(p−q)RI/2, and this amplifier therefore provides a zero differential voltage for this value. I and R being well defined values, the value (p−q)RI/2 represents a well determined reference voltage which can serve in the analogue/digital conversion.

Intermediate taps can be chosen such that p−q is even: p−q=0, p−q=2, p−q=4, p−q=6, etc., and p−q=−2, p−q=4, p−q=6, etc. in such a way as to define n regularly distributed voltage references $V_k$, namely 0, RI, 2RI, 3RI, etc. and −RI, −2RI, −3RI, etc.

The n amplifiers are then connected to different duos of taps, each duo corresponding to one of these reference voltages.

The first amplifier is connected to a first tap (p=0) of the first bridge and to a last tap (q=n−1) of the second bridge; the second is connected to the second tap (p=1) of the first bridge and to the penultimate tap (q=n−2) of the second, and so on and so forth, the middle amplifier is connected to a median tap of the first bridge and a median tap of the second bridge, etc., up to the last amplifier which is connected to the last tap of the first bridge and to the first tap of the second bridge.

In the example represented, there are ten useful resistors in the bridge and eleven amplifiers $A_0$ to $A_{10}$ whose input voltages cross over for Vin equal to the following 11 voltage references $V_k$: −5RI, −4RI, −3RI, −2RI, −RI, 0, RI, 2RI, 3RI, 4RI, 5RI The differential amplifier $A_k$, of rank k in this series, provides two differential output voltages $VA_k$ and $V'A_k$, varying with Vin in phase opposition, monotonically. The voltage $VA_k$ increases with Vin, the voltage $V'A_k$ decreases with Vin. These two voltages cross over in a zone of linear variation, where they vary linearly, and the crossover point is situated at a value of Vin equal to a reference voltage $V_k$. In the case where the eleven voltage references hereinabove have been chosen distributed between −5RI and +5RI, the amplifier of rank k corresponds to the reference $V_k$=(k−5)RI.

We have thus produced n pairs of voltages varying monotonically with Vin, the voltages of a pair of rank k crossing over when Vin has a reference value equal to $V_k$, the voltages $V_k$ being regularly distributed.

Figure 2:
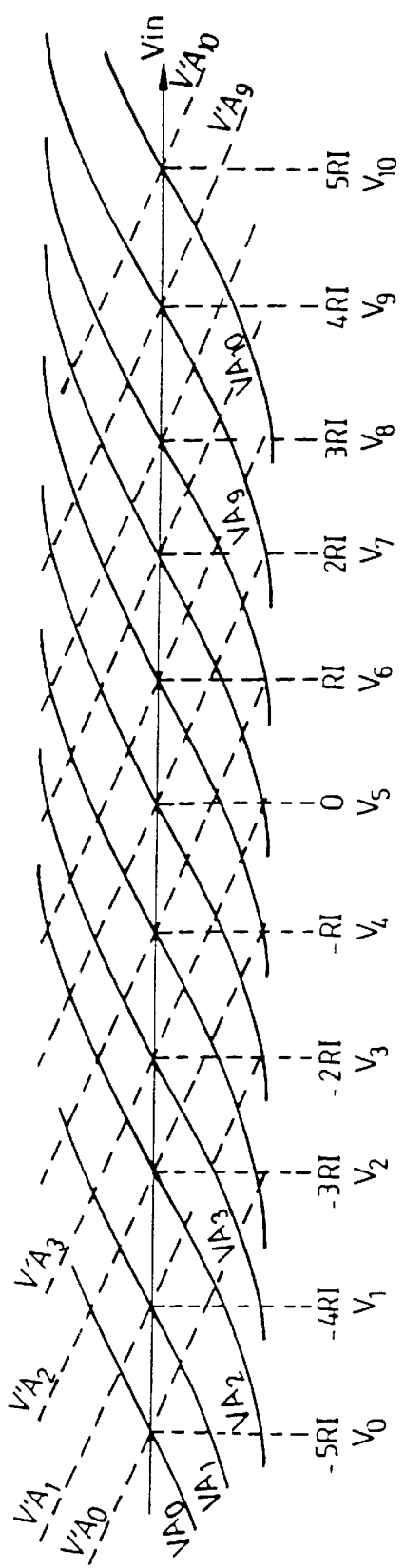
FIG. 2 represents a graph of the variation, as a function of Vin, of the input voltage pairs of the folding circuit.

FIG. 2 represents the graphs of the variation of these voltage pairs as a function of Vin.

Returning to FIG. 1, these n voltage pairs serve to control a set of several current routing circuits, referenced CA0 to CA5, and the outputs of the various routing circuits will be connected together to provide two so-called folded signals, that is to say signals varying with Vin in a periodic manner according to a substantially sinusoidal form, the two folded signals varying with Vin strictly in phase opposition and crossing over at each of the references $V_k$ except at the ends $V_o$ and Vn−1, in a zone of linear variation around $V_k$.

Stated otherwise, the set of routing circuits will produce a single pair of folded signals SR and SRb crossing over at the various points $V_k$, from n pairs of monotonic signals each crossing over at a single point $V_k$.

Figure 3:
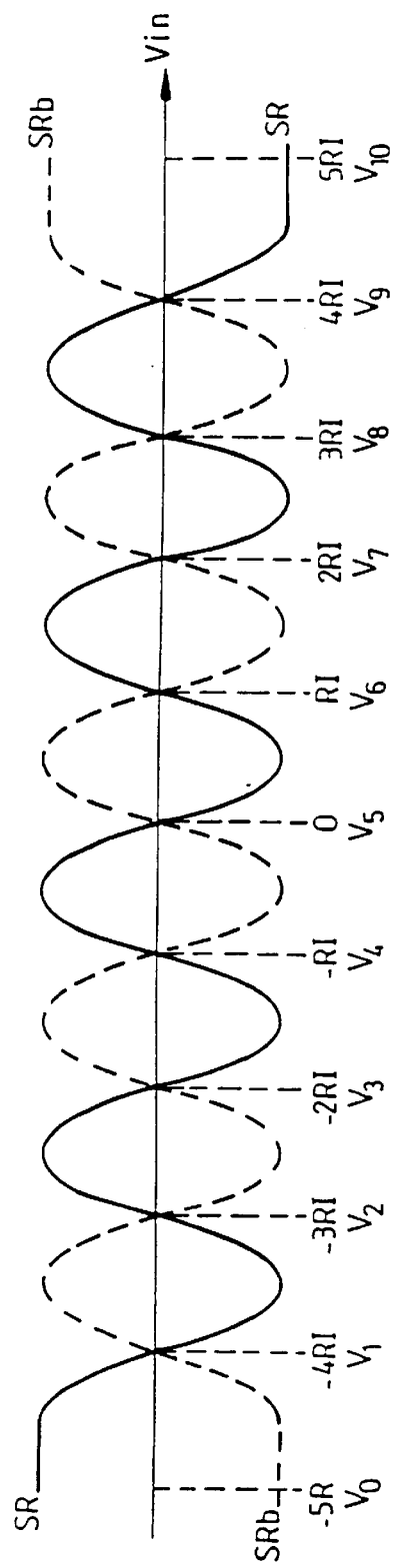
FIG. 3 represents a graph of the variation of the folded voltages.

FIG. 3 represents the signals folded by the folding circuit.

The folding circuit is designed according to the invention in such way as to minimize the current consumption without reducing the accuracy of the folded signals (that is to say their position with respect to references $V_k$ and their linearity of variation as a function of Vin in the crossover zones).

The folding circuit comprises several current routing circuits which are tree-like-like structures which will be described in detail hereinafter. It may already be stated in general that these are structures having Z current routing stages, Z being at least equal to 2, and that they then comprise $2^z-1$ pairs of input voltages for controlling the routers, and $2^Z$ current output branches.

Considered in FIG. 1 is the simplest case where Z=2 and there are therefore three input pairs E, Eb; F, Fb; G, Gb, and four current output branches A, B, C, D in each routing circuit.

The outputs B and C will be regarded as main outputs for the production of the folded signals and will be called the direct output and the inverse output respectively. The outputs A and D are auxiliary outputs.

In the example represented in FIG. 1, there are six successive routing circuits CA0 to CA5.

A routing circuit of arbitrary rank i, with the exception of the end circuits which are connected slightly differently so as to take account of the edge effects of the folding curves, respectively receives on its pairs of inputs (E, Eb), (F, Fb), (G, Gb) the pairs of control voltages emanating from three adjacent amplifiers $A_{k-1}, A_k, A_{k+1}$. The next circuit receives the next three pairs with, however, an overlap, in the sense that the next circuit receives on its first pair of inputs E, Eb the same voltage pair (for example emanating from $A_{k+1}$) which is applied to the last pair of inputs G, Gb of the previous circuit.

Thus, the circuit CA1 receives the output voltages from the amplifiers $A_1, A_2, A_3$. The circuit CA2 receives those from $A_3, A_4, A_5$, etc.

The circuit of rank i therefore receives on its inputs E and Eb respectively the output $VA_{k-1}$ from the amplifier $A_{k-1}$, which output varies as Vin and which may be called the positive output, and the output $V'A_{k-1}$ from $A_{k-1}$ which varies as −Vin and which may be called the negative output; on its inputs F and Fb, it respectively receives the positive output $VA_k$ and the negative output $V'A_k$ from $A_k$; and on G and Gb it receives the positive output $VA_{k+1}$ and the negative output $V'A_{k+1}$ from $A_{k+1}$.

The end circuit CA0 receives only the outputs from $A_0$ (on E, Eb and F, Fb) and $A_1$ (on G, Gb). The circuit of the other end CA5 receives only those from $A_9$ (on E, Eb) and $A_{10}$ (on F, Fb and G, Gb).

The direct main outputs B of the routing circuits CA1 to CA5 are linked together and are linked to a load resistor Rs. The role of this resistor is to add together the currents emanating from these direct outputs, and to convert the sum of currents into a voltage. The voltage produced then represents a first folded signal SR such as that of FIG. 3. In practice, a transistor in a cascode arrangement (base at constant potential VH) will be inserted in series between the merged outputs B and the resistor Rs, so as to render the voltage on the outputs B independent of the sum of the currents passing through the resistor Rs. The folded signal SR is then tapped off from the junction point of the resistor and of the collector of the transistor.

In the same way, the inverse outputs C of the routing circuits CA0 to CA4 are linked to another load resistor Rsb and provide the second folded signal SRb, varying with Vin in phase opposition with the first.

To terminate the folding at the ends of the range of variation of Vin, the two extreme references $V_0$ and $V_{10}$ are used, and the outputs A and B of the circuit CA0 are linked to the resistor Rsb and the outputs C and D of the circuit CA5 are linked to the resistor Rs.

The auxiliary outputs A and D of the various routing circuits are used to gather information on the position of Vin with respect to the various references $V_k$ and thus to obtain high-order bits B0, B1, B2, of an analogue/digital conversion whose low-order bits will be obtained with the aid of an interpolation circuit, not represented, from the folded signals SR and SRb.

This use of the outputs A and D for the high-order bits will be returned to later, but broadly it may already be indicated here that it will be necessary to combine the currents from the auxiliary outputs A and D of several routing circuits so as to obtain these bits B0 to B1, B2.

The general architecture of the folding circuit having thus been described with reference to FIG. 1, the precise makeup of the routing circuits will now be described.

Each routing circuit has a tree-like structure so as to route the current from a single current source tied to this circuit, preferably to one or other of several differential branches organized as successive stages. This is a tree-like routing structure in the sense that each branch of a stage is subdivided into two branches of a higher stage, and the current is subdivided in these two branches as a function of a respective routing control for each branchoff. This routing control is performed by a pair of input voltages, and the apportioning of the current in the two branches is dependent on the difference between these input voltages. There are as many pairs of control voltages as there are branchoffs: three for a two-stage structure, seven for a three-stage structure, $2^z-1$ for Z stages.

Figure 4:
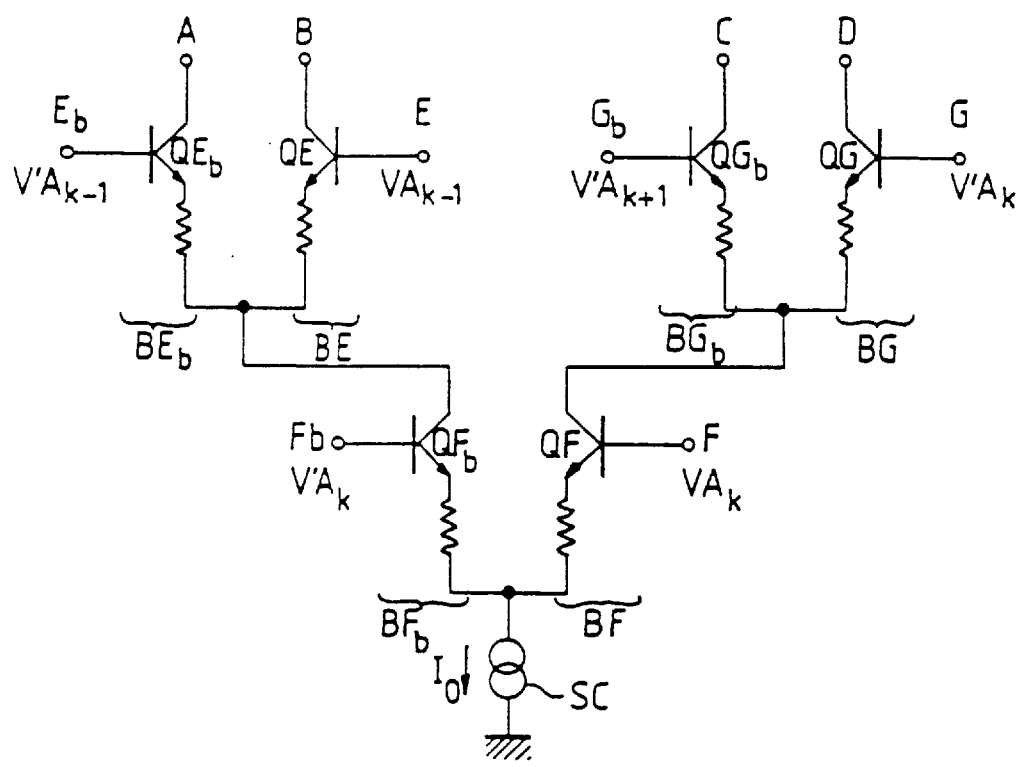
FIG. 4 represents a routing circuit diagram with two stages.

FIG. 4 represents the simplest routing structure according to the invention, that is to say a two-stage structure.

It comprises a current source SC delivering a constant current $I_0$ which is the same for all the routing circuits.

The current source SC supplies two differential branches (first routing stage), each of which itself divides into two other branches (second routing stage).

The differential branches BF and BFb of the first stage each comprise a transistor QF, QFb, linked by its emitter to the current source through an emitter resistance. These transistors control the single router of the first stage of the tree-like structure. The bases of these transistors are the inputs Fb and F of the routing circuit and they receive the voltages $V'A_k$ and $VA_k$ of the amplifier Ak, which voltages cross over for Vin=$V_k$. The current is routed mainly to the branch BF if Vin is greater than $V_k$ and mainly to the branch BFb if Vin is less than $V_k$.

Around $V_k$, the share of the current in the two branches varies linearly with Vin. The emitter resistances have moreover the single role of increasing the span of linearity of variation of the currents in the branches, in the neighbourhood of the crossover point $V_k$.

The branch BFb subdivides into two branches BE, BEb with a transistor QE and a transistor QEb respectively, driven by the voltages $VA_{k-1}$ and $V'A_{k-1}$. The transistors QE and QEb constitute a first router of the second stage of the tree-like structure. They are connected by their emitters to the branch BFb, that is to say to the collector of the transistor QFb. Emitter resistances can also be provided for the transistors QE and QEb. The current of the branch BFb is routed mainly into the branch BEb or into the branch BE according to whether Vin is less than or greater than $V_{k-1}$, and the share of the current varies linearly with Vin in the neighbourhood of $V_{k-1}$.

The branch BF also subdivides into two branches BG and BGb respectively comprising a transistor QG and a transistor QGb, constituting a second router of the second stage, identical to the first router. The routing is driven by the differential voltage between $VA_{k+1}$ and $V'A_{k+1}$; the current of the branch BF is routed mainly into the branch BGb or into the branch BG according to whether Vin is less than or greater than $V_{k+1}$. The share of the current varies linearly in the neighbourhood of $V_{k+1}$.

The collector of the transistor QE constitutes the current output B of the circuit (direct output).

The collector of the transistor QGb constitutes the current output C of the circuit (inverse output). These outputs serve for the formulation of the folded signals. They are linked to a positive potential by way of the resistors Rs and Rsb (FIG. 1) which convert the current into voltage after summing the currents from several routing circuits.

The collectors of the transistors QG and QEb constitute the auxiliary outputs A and D of the routing circuit, which are intended for formulating information on the position of Vin with respect to the successive foldings of the signal.

A practical remark will be made here regarding the control of the transistors of the circuit by differential voltages $VA_k$, $V'A_k$: it is desirable for the transistors QE, QEb, QG, QGb, of the second routing stage to be supplied with differential voltages whose common mode is higher than that of the differential voltages which control the transistors QF, QFb of the first stage, so as to take account of the fact that there is necessarily a difference in bias of the transistors of the second stage with respect to those of the first stage.

The amplifiers $A_{k+1}$ and $A_{k-1}$ ought therefore to have outputs whose common-mode level is shifted with respect to the outputs of $A_k$. However, as other neighbouring routing circuits receive $A_{k+1}$ or $A_{k-1}$ on their first routing stage and not on the second, it is in practice necessary to make provision for each of the amplifiers such as $A_k$ to comprise not only two outputs $VA_k$, $V'A_k$, having the common mode matched to the control of a first routing stage, but also two other outputs, providing the same differential voltage but with a shifted common mode, and which are matched to the control of the transistors of a second routing stage.

This particular feature has not been represented so as not to overburden the diagram, but one is well aware of how to make stages for shifting level at the output of the differential amplifiers. These stages preserve the differential voltages by shifting their common-mode voltage.

For routing structures with three or more stages, it is also necessary to take this problem into account and to provide shifted-common-mode outputs specifically where necessary.

The basic structure of the routing circuit is represented in FIG. 4 without the auxiliary circuit elements making it possible to supply current to the various branches of the circuit. However, it is understood that functioning as a current routing circuit is possible only if the outputs A, B, C, D are linked to a positive potential capable of providing the current drawn by the source SC. As regards the outputs B and C, it has already been explained with reference to FIG. 1 that they are linked to the supply Vcc by the resistors Rs and Rsb used in common by all the routing circuits CA0 to CA5. As regards the outputs A and D, it would be possible to link them simply to the supply voltage Vcc, preferably through a cascode-arranged transistor (common base). In this case they would have no usefulness as outputs, and they would serve only to ensure correct functioning of the routing so as to formulate the folded signals.

It is preferred however, as was stated, to use the outputs A and D to formulate information regarding the position of Vin with respect to the references $V_k$, this information constituting the high-order bits of the analogue/digital conversion in the range $V_0$ to $V_{n-1}$.

In this case, this use of the outputs A and D requires coupling of the outputs A and D of diverse routing circuits, as is moreover represented in FIG. 1, and the coupled outputs are the ones which will be linked to a positive supply. The coupling depends on the coding which is used in the analogue/digital conversion.

Before entering into the details of this coupling of the outputs A and D, the reason why the routing circuits coupled by their outputs B and C produce folded signals SR and SRb such as those of FIG. 3 may be summarized in a few words.

It is for example possible to take the routing circuit CA2 and to observe the behaviour of the current of the output B, that is to say the current in the branch BE of CA2. When Vin is much less than $V_3$, the current passes mainly through the branch BFb, and from there goes through to the branch BEb. The branch BE scarcely allows any current to pass. Then when Vin approaches $V_3$, the current of the branch BFb begins to pass substantially through the branch BE and even mainly through the branch BE when $V_3$ is exceeded; however when Vin approaches $V_4$ then exceeds $V_4$, the current in the branch BFb decreases progressively so that even if the branch BE becomes favoured with respect to the branch BEb, it is supplied less and less. Finally, when Vin becomes much greater than $V_4$, the branch BE no longer receives any current at all. The current in the branch BE therefore starts from zero and returns to zero after having passed through a maximum in the middle of the interval between V3 and V4. Likewise for the current in the branch BE of the next routing circuit CA3, but the current maximum lies between V5 and V6, so that when the current in the branch BE of the circuit CA2 gets near zero, the current in the branch BE of the circuit CA3 has already begun to increase. The sum of the two currents then passes through a maximum between $V_3$ and $V_4$, then a nonzero minimum situated between $V_4$ and $V_5$, then again a maximum between $V_5$ and $V_6$. The global curve of the variation of the sum of the currents in several routing circuits is a sinusoid such as that of FIG. 3, whose maxima and minima are situated in the middle of the intervals between two adjacent voltages $V_k$.

We now return to the makeup of the outputs A and D, which are intended to provide binary information on the position of Vin with respect to the references $V_k$. This makeup is based on analogous reasoning regarding additions of current in branches controlled by different routers.

In the example described, a Gray code is preferably used to digitally code the value of Vin, since this code can be obtained with simple couplings between the various routing circuits.

Figure 5:
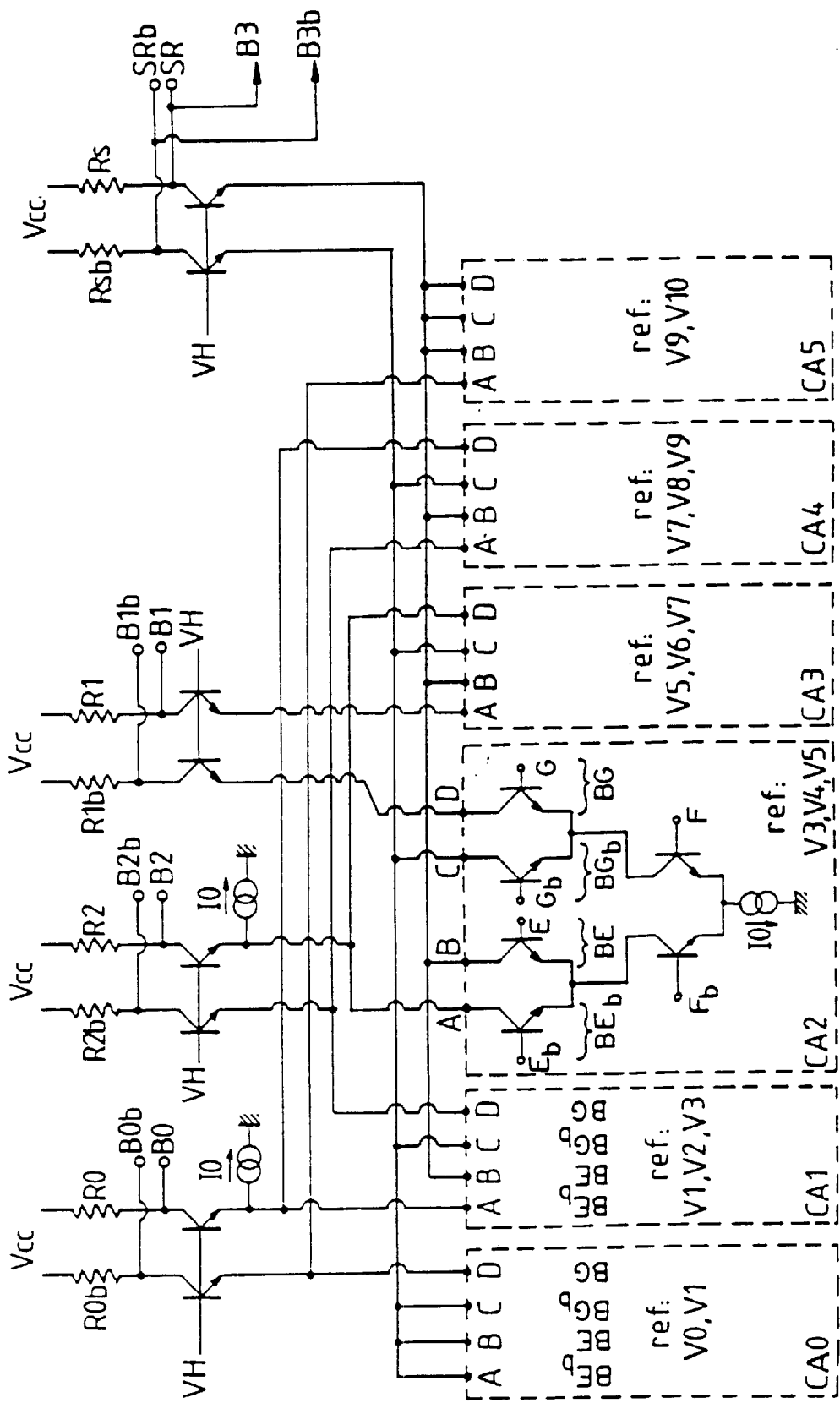
FIG. 5 represents the association of several routing circuits allowing the formulation of the folded signals and of the high-order bits of the analogue/digital conversion.

FIG. 5 represents more precisely the coupling between the six routing circuits, again in the case where there are eleven references $V_k$ defined by the divider bridges.

For a proper understanding of this coupling, it is recalled that the high-order bits B0, B1, B2 of the Gray code can be obtained in the following manner with respect to the reference voltages of the conversion:

B0=0 if Vin is less than $V_1$ or greater than $V_9$
B0=1 if Vin is in the useful range between $V_1$ and $V_g$
B1=0 if Vin is in the bottom of the range: Vin<$V_5$
B1=1 if Vin is in the top of the range: Vin>$V_5$
B2=0 if Vin is less than $V_3$ or greater than $V_7$
B2=1 if Vin lies between $V_3$ and $V_7$
The coding table is then as follows:

|       | $V_1$ | $V_2$ | $V_3$ | $V_4$ | $V_5$ | $V_6$ | $V_7$ | $V_8$ | $V_9$ |
|-------|-------|-------|-------|-------|-------|-------|-------|-------|-------|
| B0 =  | 0     | 1     | 1     | 1     | 1     | 1     | 1     | 1     | 0     |
| B1 =  | 0     | 0     | 0     | 0     | 0     | 1     | 1     | 1     | 1     |
| B2 =  | 0     | 0     | 0     | 1     | 1     | 1     | 1     | 0     | 0     |
| (B3 = | 1     | 0     | 1     | 0     | 1     | 0     | 1     | 0     | 1     | 0) |

Bit B3, defining the position of Vin with respect to $V_2$, $V_4$, $V_6$ and $V_8$, is defined in this case in pure binary and not as a Gray code, since it is simpler to achieve:

B3=1 if Vin lies between $V_2$ and $V_3$, or $V_4$ and $V_5$, or $V_6$ and $V_7$, or $V_8$ and $V_9$,
B3=0 in the converse case.

Figure 6:
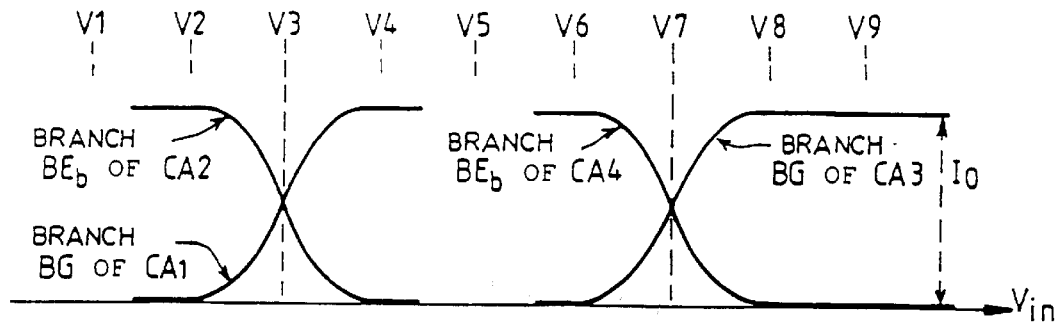
FIG. 6 represents the currents in certain branches of routing circuits whose outputs are connected together.
Figure 7:
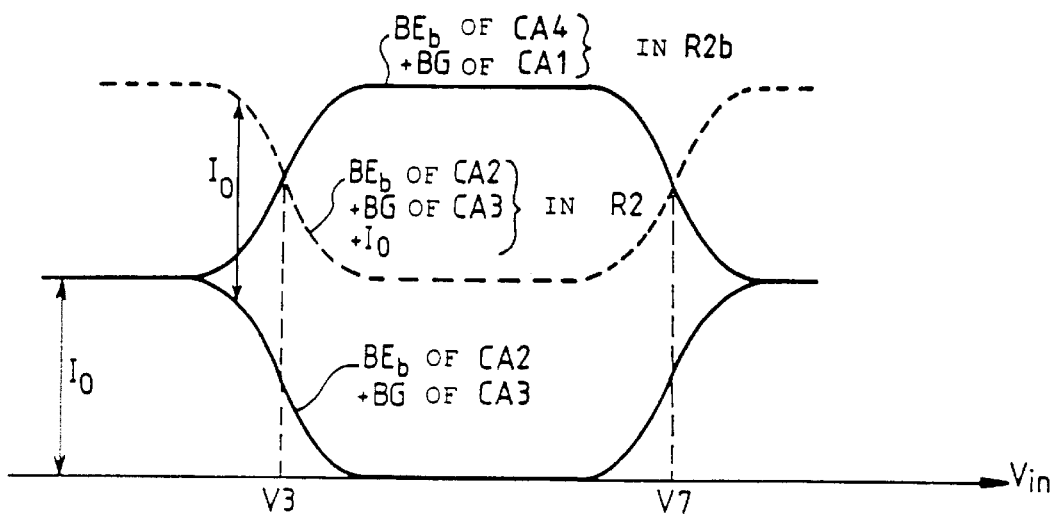
FIG. 7 represents the additions of current in the resistors R2 and R2b of FIG. 5, allowing the formulation of bit B2 of the analogue/digital conversion.

The branch BEb of the circuit CA2 preferentially receives a current if Vin is less than $V_3$. The branch BG of the circuit CA3 preferentially receives a current if Vin is greater than $V_7$. FIG. 6 represents these currents as a function of Vin. These currents are merged in a resistor $R_2$ by passing through a cascode-arrangement transistor. FIG. 7 represents the addition of these currents (lower curve in the figure). A current source of value $I_0$ is moreover added so that this current Io is added to the two previous ones in the resistor R2 (dashed curve in FIG. 7).

Conversely, a current preferentially passes through the branch BG of CA1 if Vin is greater than $V_3$, and a current preferentially passes through the branch BEb of CA4 if Vin is less than $V_7$. FIG. 6 also represents these currents. These currents are merged in a resistor R2b, by passing through a cascode-arrangement transistor. FIG. 7 also represents the addition of these two currents in the resistor R2b (solid upper curve).

The curves of the current in R2 and R2b cross over for Vin equal to $V_3$ and cross over again for Vin equal to $V_7$. Comparison of these currents (by comparing the voltages at the terminals of R2 and R2b) indicates unambiguously whether Vin is situated between $V_3$ and $V_7$, thus giving bit B2 and its complement B2b.

The resistors R2 and R2b therefore serve as is apparent both in performing a current summation (which is an analogue OR function) and a current/voltage conversion. These detailed explanations make it possible to understand the complete structure of the connections of FIG. 5.

Indeed, apart from the connections just described and which serve to establish the bits B2 and B2b, analogue connections are provided for establishing the bit B1 and its complement B1b. It is sufficient to tap the output A of the circuit CA3, which preferentially provides a current if Vin is less than $V_5$ (bit B1), and the output D of the circuit CA2, which preferentially provides a current if Vin is greater than V5. The output A is linked to a current/voltage conversion resistor R1. The output D is linked to an identical resistor R1b. The sign of the differential voltage between the two resistors represents the value of the bit B1.

To establish the bit B0 and its complement B0b, the output A of CA1 (preferential current if Vin<$V_0$) and the output D of CA4 (preferential current if Vin>$V_9$) are linked to a summation and conversion resistor R0, and the output D of CA0 is linked to the output A of CA5 and to a summation and conversion resistor R0b. current source of value Io adds a current on the resistor R0, as for the resistor R2 and for the same reasons (to obtain two symmetric curves of current in R0 and R0b which cross over for $V_1$, and $V_9$).

The last bit B3 of the high-order bits of the analogue/digital conversion effected by the folding circuit can be obtained by comparing the folded signals SR and Srb since the difference between these signals changes sign with each value $V_k$.

Logic comparators (not represented) are envisaged for providing the bits B0 to B3 and their complements in logic form from the analogue voltages present at the terminals of the resistors.

The folded signals SR and SRb can be applied to an interpolation structure from which are derived supplementary low-order bits of the analogue/digital conversion.

If the interpolation structure is a parallel structure receiving the folded signals and formulating in parallel the comparisons between the folded signals and voltage references, one may be content with the signals SR and SRb. Such is the case for example if the folded signals are applied to a dual divider bridge of the same kind as that represented in FIG. 1, or to a single divider bridge whose taps define known reference voltages.

If on the contrary the structure is a cascaded structure, in which fictitious intermediate voltage references are created successively so as to obtain the bits of lower and lower order, it will in general be necessary to employ two other folded signals SRQ and SRQb, whose curves of variation with Vin are in phase quadrature with those of the first two SR and SRb. Such is the case when, by mixing two pairs of phase quadrature analogue voltages, two other pairs of folded voltages are created, also in phase quadrature, and having, as well as the previous crossover points, new crossover points situated in the middle of the interval between the previous crossover points.

Figure 8:
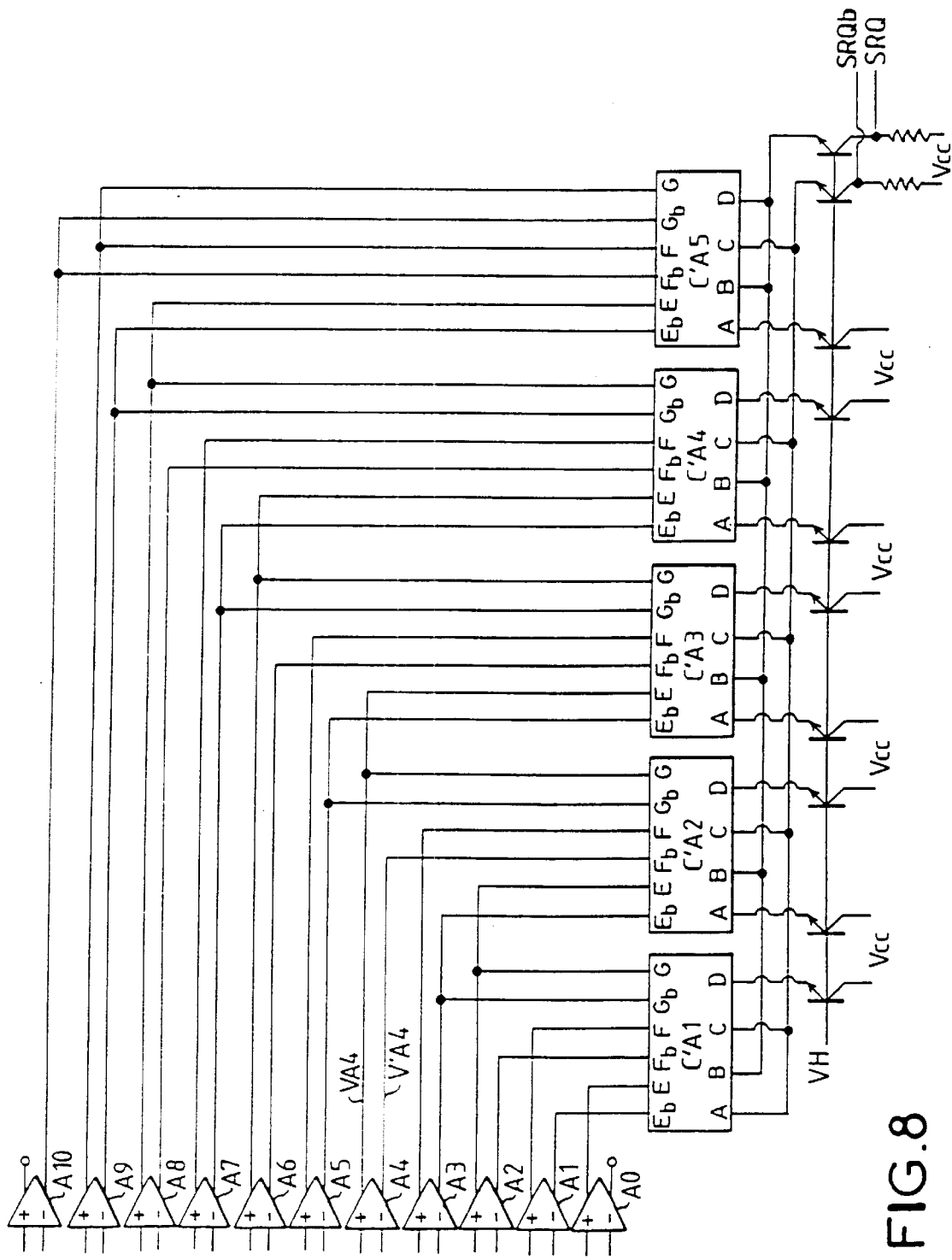
FIG. 8 represents a second folding circuit, producing two other folded voltages, in phase quadrature with the first two.

FIG. 8 shows how the phase quadrature folded signals SRQ and SRQb can be created from the outputs of the same differential amplifiers $A_0$ to $A_{n-1}$, with the aid of other current routing circuits. The routing circuits CA'0 to CA'5 serving to formulate the first folded signals have not been represented in FIG. 8 so as not to complicate the figure. Represented are the five routing circuits CA'1 to CA'5, which are identical to the circuits of FIG. 4 and which therefore each have four outputs A, B, C, D and three pairs of inputs (Eb, E), (Fb, F) and (Gb, G).

Whilst an input pair of a routing circuit of FIG. 1 systematically receives a pair of outputs of one of the amplifiers $A_0$ to $A_{n-1}$, here a pair of inputs of a routing circuit receives a positive output of an amplifier, for example $A_k$, and a negative output of an adjacent amplifier $A_{k+1}$ or $A_{k-1}$. These pairs of voltages cross over for voltage references $V'_k$ in the middle of the intervals between the references $V_k$, and the additions of currents obtained by linking all the outputs B and all the outputs C of the routing circuits make it possible to formulate folded signals SRQ and SRQb, in phase quadrature with SR and SRb.

Typically, the pair of inputs Fb, F of a routing circuit of rank i respectively receives the negative output of $A_k$ and the positive output of $A_{k-1}$. The pair Eb, E receives the negative output of $A_{k-1}$ and the positive output of $A_{k-2}$. The pair Gb, G receives the negative output of $A_{k+1}$ and the positive output of $A_k$.

As in FIG. 4, the outputs B are all linked together (direct output) and linked by way of a cascode transistor to a resistor supplied from Vcc. And all the outputs C are linked by way of another cascode transistor to another resistor linked to Vcc. The folded signals SRQ and SRQb are extracted on the resistors.

To terminate the folding on the $V_0$ side and on the $V_{10}$ side, provision is made for the output A of C'A1 to be linked to the output C, and for the output D of C'A5 to be linked to the output B.

If there is no need to formulate other logic information all the other branches A or D which are not used for the folding can be connected to Vcc by way of cascode transistors as is represented in FIG. 8. If there is a need to formulate supplementary logic information relating to the position of Vin with respect to the references $V'_k$, this can be done by linking together the outputs A and/or D of certain routing circuits.

The folding circuits described with reference to the previous figures use tree-like current routing circuits with two stages. The invention proposes to extend this concept to three stages, or even more.

Figure 9:
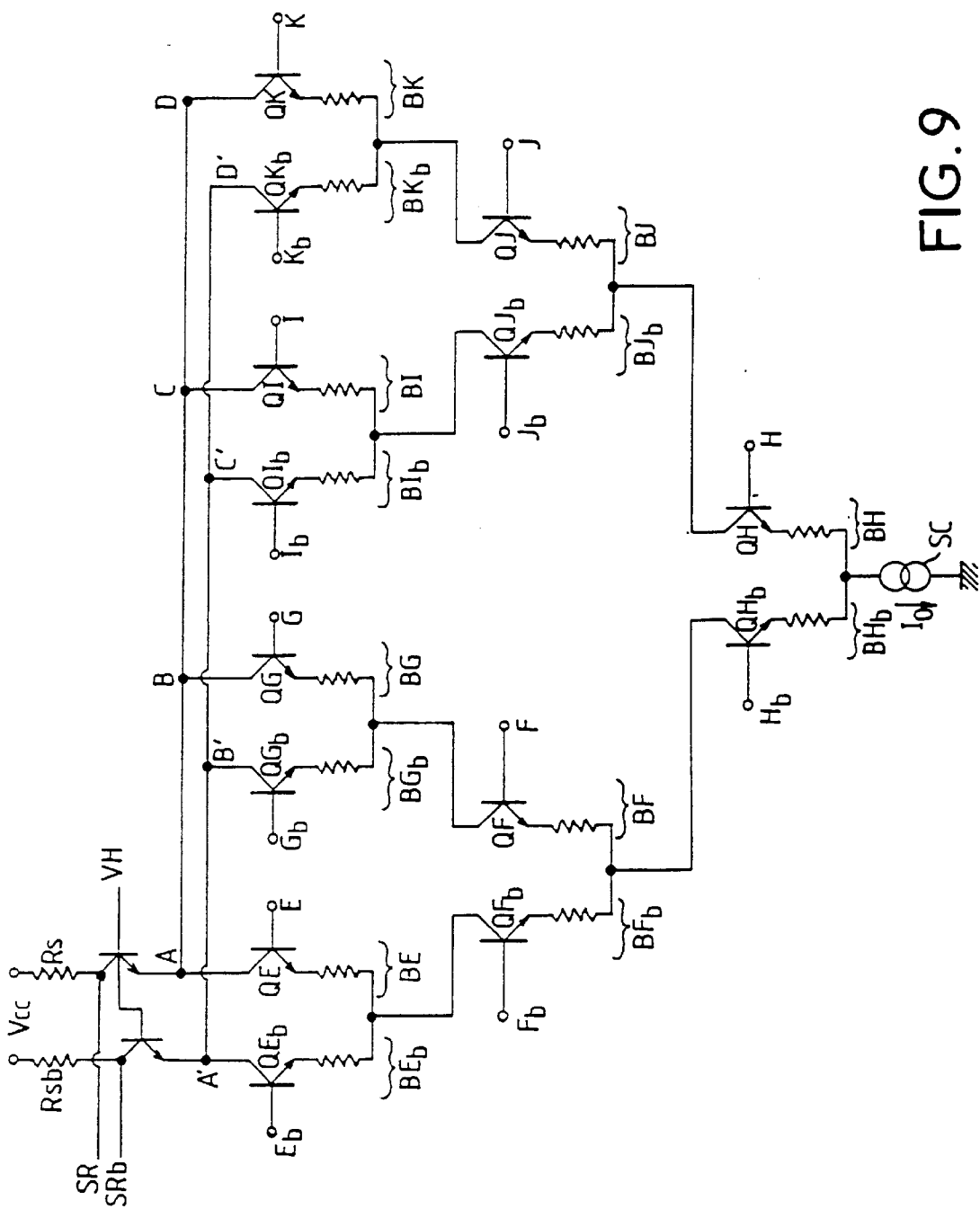
FIG. 9 represents a routing circuit with tree-like-like structure with three stages producing two folded voltages.

FIG. 9 represents a three-stage routing circuit.

It can already be noted that the invention is then usable even with a single routing circuit when the number of reference voltages of crossover of the folded signals is less than or equal to 8.

If it is greater than 8, the outputs of several routing circuits must be connected together as in the case of the two-stage routing circuits.

The first routing stage of FIG. 9 comprises two branches BH and BHb, respectively comprising the transistor QH controlled by the input H and the transistor QHb controlled by the input Hb. Emitter resistances can be provided. The input H will receive a voltage $VA_k$ emanating from a differential amplifier $A_k$. The input Hb will receive a complementary voltage $V'A_k$. The voltages $VA_k$ and $V'A_k$ cross over for the reference $V_k$.

The branch BH is divided into two branches BJ, BJb with routing transistors QJ, QJb. The branch BHb is divided into two branches BF, BFb, with two routing transistors QF, QFb. The four branches BF, BFb, BJ, BJb constitute the second stage of routers, and this second stage comprises two routers. The voltages applied to the control inputs F, Fb and J, Jb of these two routers emanate from the amplifiers $A_{k-2}$ and $A_{k+2}$ respectively. These voltages cross over for the references $V_{k-2}$ and $V_{k+2}$ respectively.

The branches BJ, BJb, BF, BFb are again each subdivided into two branches constituting the third stage of routes. There are four routers in the third stage. These four routers, apportioning the current between the eight branches BK, BKb, BI, BIb, BG, BGb, BE, BEb, with their respective transistors QK, QKb, QI, QIb, QG, QGb, QE, QEb, are controlled by the pairs of output voltages of the amplifiers $A_{k-3}$, $A_{k-1}$, $A_{k+1}$, $A_{k+3}$ respectively. The pairs of voltages cross over for the references $V_{k-3}$, $V_{k-1}$, $V_{k+1}$, $V_{k+3}$.

These eight branches constitute the eight output branches of the router with tree-like structure. The currents of these branches are gathered on the outputs A, B, C, D for the branches BE, BG, BI, BK, and on the outputs A', B', C', D' for the branches BEb, BGb, BIb, BKb.

The signal folding is performed in this very routing circuit, by merging the outputs A, B, C, D on the one hand and the outputs A', B', C'D' on the other hand. The currents of the merged branches are added together in two resistors R and Rb respectively, with interposition of a cascode transistor if so desired. The folded signals SR, SRb are extracted at the terminals of the corresponding resistor.

This routing circuit can be coupled to a neighbouring circuit receiving the outputs from amplifiers $A_{k+3}$ to $A_{k+10}$, using the principles set out with regard to the two-stage routing circuits: in practice, two neighbouring routing circuits receive voltages emanating from different amplifiers, with however an overlap in the sense that the inputs K, Kb of one routing circuit receive the same voltages as the inputs E, Eb of the next router. The outputs ABCD of one of the routing circuits are linked to the outputs ABCD of the other stage, with the exception of that of the outputs which corresponds to an overlap. Likewise for the outputs A', B', C', D'. For example, if there are two adjacent routing circuits, the outputs ABC of the first circuit will be linked to the outputs ABCD of the second, and the outputs A'B'C'D' of the first circuit will be linked to the outputs A'B'C' of the second.

What is claimed is:

1. Analogue/digital converter characterized in that the analog/digital converter comprises a signal folding circuit comprising:

means for producing n pairs of voltages ($VA_k$, $V'A_k$) varying monotonically with Vin, the voltages of a pair of rank k crossing over when Vin has a reference value equal to $V_k$ and varying linearly around this crossover point, the voltages $V_k$ being regularly distributed, at least two current routing circuits, each of which possesses at least three pairs of inputs and at least two outputs called the direct output and the inverse output, a routing circuit of rank i having the following characteristics:

the routing circuit receives at least the voltage pairs of rank k−1, k and k+1, the circuits of different rank receiving different sets of voltage pairs, the routing circuit comprises a current source supplying a group of branches arranged as a tree-like structure with at least two stages, the last of which comprises at least four branches, each branch of a stage supplying two branches of the next stage, the apportioning of the current in each branchoff being dependent on the voltage pairs of rank k−1, k and k+1, and the direct and inverse outputs of this circuit being tapped respectively from two different branches of the last stage, the direct outputs of the various routing circuits being linked together so as to add together the currents which flow through them and providing a first folded signal and the inverse outputs also being linked together and providing a second folded signal SRb complementary to the first.

2. The Converter according to claim 1, characterized in that the routing circuits have two stages and route the current selectively to one of the four branches of the second stage.

3. The Converter according to claim 2, characterized in that the analog/digital converter comprises at least (n−1)/2 routing circuits so as to produce the folded signals SR and SRb.

4. The Converter according to claim 1, characterized in that the routing circuits have three stages and to route the current selectively towards one or other of eight branches of the third stage as a function of the position of Vin with respect to seven voltage references which are $V_{k-3}$, $V_{k-2}$, $V_{k-1}$, $V_{k1}$, $V_{k+1}$, $V_{k+2}$, $V_{k+3}$, means being provided so as to add together on the one hand the currents circulating in at least three of the branches and on the other hand the currents circulating in at least three other branches.

5. The Converter according to claim 4, characterized in that the signal folding circuit comprises M current routing circuits with tree-like structure with Z stages supplied by a current source, with Z at least equal to 2, each routing circuit having $2^z-1$ pairs of inputs each receiving a voltage pair tapped off from the n pairs, the $2^z-1$ voltage pairs corresponding to $2^z-1$ adjacent references $V_k$, the current of the source being routed selectively into one branch from among $2^z$ output branches as a function of the values of the input voltages, and the routing circuit having a direct output obtained by the merging of $2^z-1$ different output branches and an inverse output obtained by the merging of $2^{z-1}-1$ other output branches, the direct outputs of the various routing circuits being linked together and providing a first folded signal, and the inverse outputs also being linked together and providing a second folded signal.

6. The Converter according to one of claim 1, characterized in that the routing circuits comprise auxiliary outputs providing currents as a function of the position of Vin with respect to the references $V_k$, and in that the auxiliary outputs are used to establish a high-order logic cue relating to the position of Vin with respect to the references $V_k$.

7. Converter according to one of claim 1, characterized in that the routing circuits comprise transistors in each routing stage, these transistors being controlled by the outputs of differential amplifiers providing the voltage pairs $VA_k$, $V'A_k$, the amplifiers providing differential voltages $VA_k-V'A_k$ with a common mode which depends on the rank of the routing stage in the tree-like structure.

8. Converter according to one of claim 1, characterized in that it comprises a second folding circuit comprising current routing circuits with tree-like structure, the routing circuits receiving on a pair of inputs one voltages of a pair of voltages of rank k and one of the voltages of a pair of adjacent rank, so as to obtain two other complementary folded signals varying as a function of Vin in phase quadrature with the first two folded signals.

* * * * *